US010761425B2

(12) United States Patent
Magdassi et al.

(10) Patent No.: US 10,761,425 B2
(45) Date of Patent: Sep. 1, 2020

(54) PARTICULATE PHOTOINITIATORS AND USES THEREOF

(71) Applicant: Yissum Research Development Company of the Hebrew University of Jerusalem Ltd., Jerusalem (IL)

(72) Inventors: Shlomo Magdassi, Jerusalem (IL); Liraz Larush, Jerusalem (IL); Ido Cooperstein, Haifa (IL); Amol Ashok Pawar, Jerusalem (IL)

(73) Assignee: Yissum Research Development Company of the Hebrew University of Jerusalem Ltd., Jerusalem (IL)

( * ) Notice: Subject to any disclaimer, the term of this patent is extended or adjusted under 35 U.S.C. 154(b) by 168 days.

(21) Appl. No.: 15/778,117

(22) PCT Filed: Nov. 23, 2016

(86) PCT No.: PCT/IL2016/051260
§ 371 (c)(1),
(2) Date: May 22, 2018

(87) PCT Pub. No.: WO2017/090038
PCT Pub. Date: Jun. 1, 2017

(65) Prior Publication Data
US 2018/0348631 A1    Dec. 6, 2018

Related U.S. Application Data

(60) Provisional application No. 62/258,592, filed on Nov. 23, 2015.

(51) Int. Cl.
*G03F 7/028* (2006.01)
*G03F 7/004* (2006.01)
(Continued)

(52) U.S. Cl.
CPC .............. *G03F 7/028* (2013.01); *C08F 2/50* (2013.01); *G03F 7/0037* (2013.01);
(Continued)

(58) Field of Classification Search
CPC ...... G03F 7/028; G03F 7/0048; G03F 7/0037; C08F 2/50; B82Y 20/00
See application file for complete search history.

(56) References Cited

U.S. PATENT DOCUMENTS 4,965,294 A     10/1990  Ohngemach et al.
5,168,087 A  *  12/1992  Li Bassi .................. C08F 2/50
                                                          502/150
(Continued)

FOREIGN PATENT DOCUMENTS

DE    10 2011 012 412 A1    8/2012
EP        2 960 306 A1    12/2015
(Continued)

OTHER PUBLICATIONS

Scaiano et al., "Photochemistry of benzophenone in micelles. Formation and decay of radical pairs", JACS 104 pp. 5673-5679 (1982).*

(Continued)

*Primary Examiner* — Martin J Angebranndt
(74) *Attorney, Agent, or Firm* — Vorys, Sater, Seymour and Pease LLP

(57) ABSTRACT

Provided is a novel class of solid water-dispersible powders, including a plurality of water-insoluble photoinitiators in nanoparticle forms for use in water-based ink formulations.

5 Claims, 4 Drawing Sheets

(51) Int. Cl.
*C08F 2/50* (2006.01)
*B82Y 20/00* (2011.01)
*G03F 7/00* (2006.01)

(52) U.S. Cl.
CPC ............ *G03F 7/0048* (2013.01); *B82Y 20/00* (2013.01); *G02B 2207/101* (2013.01)

(56) References Cited

U.S. PATENT DOCUMENTS

| | | | |
|---|---|---|---|
| 6,803,392 B1 * | 10/2004 | Kohler | ................... G03F 7/029 502/152 |
| 2010/0092763 A1 | 4/2010 | Kleiman-Shwarsctein et al. | |
| 2010/0234484 A1 * | 9/2010 | Schellenberg | ............ C08F 2/22 522/8 |
| 2016/0039851 A1 | 2/2016 | Muller et al. | |
| 2016/0108266 A1 | 4/2016 | Kosydar et al. | |
| 2016/0199267 A1 | 7/2016 | Miller | |

FOREIGN PATENT DOCUMENTS

| | | | |
|---|---|---|---|
| JP | 2005-272761 | * 10/2005 | ................ C08F 2/24 |
| WO | 01/29093 A1 | 4/2001 | |
| WO | 2008/003601 A1 | 1/2008 | |
| WO | 2014/079838 A1 | 5/2014 | |
| WO | 2015/118533 A1 | 8/2015 | |
| WO | 2016/094706 A1 | 6/2016 | |
| WO | 2016/122541 A1 | 8/2016 | |
| WO | 2017/002115 A2 | 1/2017 | |

OTHER PUBLICATIONS

Hayashi et al. "Laser flash photolysis study of the magnetic field effect on the photodecomposition of (2,4,6-trimethylbenzoyl) diphenylphosphine oxide in micellular solution", J. Phys. Chem., vol. 91 pp. 3936-3938 (1987).*

Scaiano et al., "Dynamic aspects of the behavior of aromatic ketone triplets in anionic micelles. A laser flash photolysis study", Can J. Chem., vol. 59 pp. 2368-2372 (1981).*

Fouassier et al., "Thioxanthones derivatives as photoinitiators in micelle photopolymerization", J. Appl. Poly. Sci., vol. 34 pp. 477-488 (1987).*

Anachenko et al., "A 13P-SNP study of the photolysis of (2,4,6-trimethylbenzoyl)diphenylphosphine oxide in micelles of different sizes", Chem. Phys. Lett., vol. 255 pp. 267-273 (Jun. 1996).*

* cited by examiner

PARTICULATE PHOTOINITIATORS AND USES THEREOF

TECHNOLOGICAL FIELD

The invention generally concerns photoinitiators in particulate form and uses thereof.

BACKGROUND

The growing concerns over developing economic and environment friendly coatings, adhesives and printing inks has led attention towards photo-polymerization of aqueous photo-curable systems. Current methods of coating (wood/automotive) result in considerable emission of volatile organic compounds that are harmful to humans and the atmosphere. To prevent or minimize such an emission, new developments in the field focus on formulations with a low solvent content, water based paints, and IR- or UV-curing systems. Among these, developing water borne UV curing systems offers several economical productivity advantages in terms of production time (fast curing/production efficiency), energy consumed (low-temperature processing; no high energy-consuming drying ovens), stability (higher shelf life, no pot-life issues), safety (little or no use of reactive diluents, non-toxic and non-flammable water base), formulation (ease of changing viscosity, color and gloss; ease of equipment clean-up) and quality of final product (scratch and chemical resistance).

Interestingly for processing of hydrogels using 3D printing/stereolithograpy (SLA), an aqueous photo-curable system is a prerequisite. The most promising application of the three-dimensional (3D) printing in soft tissue engineering is the fabrication of hydrogel-based scaffolds with predesigned structures. Complex 3D hydrogel scaffolds with a fully interconnected structure with predefined dimensions and porosity are required for effective repair or regeneration of tissues and organs. Hydrogel based scaffolds are of specific interest to tissue engineering because they provide high water content environment enabling high-cell encapsulation densities. Among the various rapid-prototyping techniques available for 3D printing of hydrogel 3D structures, stereolithography (SLA) can enable fabrication of patient specific hydrogels with high speed, high resolution and computer-aided design capabilities.

In general, processing of hydrogels using SLA based 3D printing involves aqueous solution of an oligomer or reactive monomers, photo-initiator (PI) and/or cross-linking agent. The photoinitiator plays a crucial role in determining the rate of polymerization and consequently the resulting properties of the printed object and the time required for the 3D fabrication. Ideally for fabricating hydrogels with live cells mild processing conditions are desirable, avoiding heating, stirring, use of organic solvents or UV exposure. However, in the absence of highly efficient water-soluble photoinitiators, the majority of current protocols for fabricating hydrogels utilize non efficient, poorly-water soluble photoinitiators which require substantial agitation and/or heating or mixing with organic solvents to obtain clear precursor solutions.

BACKGROUND ART

[1] WO2014079838
[2] WO2016094706
[3] WO2016122541
[4] DE102011012412
[5] US201414514463
[6] WO2015118533
[7] EP2960306
[8] US2010092763
[9] US2016199267
[10] US2016039851

SUMMARY OF THE INVENTION

Among the limited selection of commercially available water-soluble photoinitiators, the material 2-hydroxy-1-[4-(2-hydroxyethoxy)phenyl]-2-methyl-1-propanone, Irgacure 2959 or I2959 (Ciba Specialty Chemicals) is the most commonly used with aqueous photo-curable systems. Given its limited solubility in water (0.47% w/w), dissolving it requires substantial agitation and/or heating or mixing with organic solvents to completely dissolve the initiator. This difficulty is only partially resolved by using water-insoluble photoinitiators, in organic solvents, or by using their water-soluble derivatives, typically prepared through tedious synthetic procedures. Direct manipulation on the photoinitiator structure, rendering it water soluble, often decreases its photo-activity and consequently affects the overall efficiency of polymerization.

Unlike the limited number of photoinitiators available for polymerization in aqueous media, a large variety of efficient photoinitiators for non-aqueous systems is available. For example, 2,4,6-trimethylbenzoyl-diphenylphosphine oxide, TPO, while being the most efficient photoinitiator in free radical polymerization reactions, is known to absorb weakly in the visible region from 400-420 nm. Free radicals generated by TPO react at high rate constants ($\sim$0.2-6$\times$10$^7$ mol$^{-1}$ s$^{-1}$) with compounds having double bonds such as styrenes, polyesters, acrylate and vinyl monomers, resulting in fast and thorough in-depth curing/solidification of photo-curable systems. TPO exhibits good thermal and shelf stability and exhibit photo bleaching; hence it is particularly suited for systems requiring no colour or odour. It also exhibits absorption spectra at wavelengths suitable for cell encapsulation and for commercially available 3D SLA printers. However, TPO has very low water solubility (3.13 mgL$^{-1}$ at 25° C.) and as such cannot be used in aqueous inks.

The inventors of the invention disclosed herein have identified the need for aqueous UV curable inks that enable overcoming the above limitations and provide highly efficient water compatible photoinitiators, with high absorbance in the UV-visible range, for rapid 2D and 3D printing. The invention contemplates highly reactive photoinitiator nanoparticles that can be utilized in water-based ink formulations with high efficacy. The water dispersions of nanoparticles of the invention are characterized by an extinction coefficient that is more than 1000 times larger than that measured for the best commercially available and mostly used water-soluble photoinitiator, as further detailed below. The use of such dispersions renders unnecessary the need for solvents.

The high-performance aqueous dispersions of photoinitiator nanoparticles or micelles may be utilized as UV curable inks for a variety of purposes, e.g., 3D printing of water-soluble monomers, that otherwise are impossible to perform without the presence of solvents. Such water-based UV curable inks enable design of photosensitive systems operable in various conditions such as 3D printing for tailor made applications involving photopolymerization, while bringing environmental advantages by using low-energy curing systems and by avoiding the need for solvents.

Thus, in a first aspect, there is provided a solid water-dispersible photoinitiator solid nanoparticle comprising at least one water-insoluble photoinitiator. In some embodiments, the solid powder is a wet solid of such nanoparticles.

The invention further provides a water-dispersible powder comprising at least one crystallization inhibitor and nanoparticles of at least one photoinitiator material. In some embodiments, and depending on the nature of the at least one crystallization inhibitor, the powder may be solid, or a dry solid, or a wet solid.

In some embodiments, the invention provides a powder comprising nanoparticles consisting at least one photoinitiator material. In other words, in some embodiments, the nanoparticles are comprised only of photoinitiators, one or more.

In some embodiments, the at least one photoinitiator material is selected to have a molar extinction coefficient of 10 and 1,000 $M^{-1}$ $cm^{-1}$ at between 300 and 800 nm.

The invention further contemplates a solid powder according to the invention that is adapted for forming a dispersion of nanoparticles and/or micelles of the at least one photoinitiator material in an aqueous medium. In some embodiments, the aqueous medium is selected from water, an ink formulation and a UV curable ink formulation.

Thus, the invention further provides an aqueous medium comprising dispersed powder according to the invention.

Further provided is a water-based dispersion of at least one water-insoluble photoinitiator material, said at least one photoinitiator material being in a form selected from nanoparticulate and micellar forms, the at least one photoinitiator material having, in some embodiments, a molar extinction coefficient of 10 and 1,000 $M^{-1}$ $cm^{-1}$ at between 300 and 800 nm.

In some embodiments, the water-based medium is selected from water, an aqueous solution, an aqueous ink solution and an aqueous UV curable ink formulation. In some embodiments, the water dispersion is an ink formulation or a UV curable ink formulation.

In the above aspects of the invention, in some embodiments, the at least one photoinitiator material having a molar extinction coefficient of 10 and 1,000 $M^{-1}$ $cm^{-1}$ at between 300 and 500 nm.

The "photoinitiator" used in accordance with the invention is one or more water-insoluble materials capable of initiating a polymerization reaction in response to actinic radiation, e.g., UV light. As known in the art, actinic radiation is any electromagnetic radiation that is capable of inducing a photochemical reaction and has a wavelength of between at least 150 nm and 1,250 nm. As will be further disclosed hereinbelow, the photoinitiators are selected amongst such materials reactive at a wavelength between 300 nm and 800 nm.

The "water-dispersible photoinitiator solid nanoparticles", referred to herein as nanoparticles of the invention, are solid materials that may be collected and made to disperse in water (thus regarded as "water-dispersible" to differentiate from such nanoparticles that are in the state of dispersion, thus regarded as "dispersed"). The nanoparticles of the invention, as further defined hereinbelow, are contemplated as a population of solid nanoparticles that may contain a plurality of nanoparticles of the same photoinitiator material or as a mixture or blend of two or more different photoinitiator materials, as ready-for-use solid concentrate or solid powder that may be dispersed in water or in an aqueous medium (a medium comprising water, but free of organic solvents, e.g., an aqueous ink formulation) to afford a stable dispersion or a printing formulation, as a dispersion in water, and as a component in an ink formulation.

In some embodiments, the photoinitiator is a mixture of photoinitiators or a mixture of photoinitiators with at least one sensitizer.

Nanoparticles of at least one water-insoluble photoinitiator enable the use of many of the available water-insoluble materials in water-based formulations, e.g., ink formulations. The water-insoluble photoinitiators are those having no water-solubility or substantially very low water-solubility. In other words, the water-insoluble photoinitiators are selected amongst "water-insoluble" or "poorly soluble" photoinitiators having zero solubility in water ("zero gram per liter", being fully insoluble) or a solubility that is no more than 1 part to 1000 parts of water. In some embodiments, the photoinitiator, in their non-particulate form have water-solubility of below 1 $g \cdot L^{-1}$ (1 gram of the insoluble or poorly soluble photoinitiator per liter water). In some embodiments, the solubility is below 0.9 $g \cdot L^{-1}$, below 0.8 $g \cdot L^{-1}$, below 0.7 $g \cdot L^{-1}$, below 0.6 $g \cdot L^{-1}$, below 0.5 $g \cdot L^{-1}$, below 0.4 $g \cdot L^{-1}$, below 0.3 $g \cdot L^{-1}$, below 0.2 $g \cdot L^{-1}$ or below 0.1 $g \cdot L^{-1}$.

The water-insoluble photoinitiators may be converted into the corresponding nanoparticulate form by any method available in the art. In some embodiments, the method for converting the photoinitiator in a non-particulate form into the corresponding particulate form comprises drying an oil-in-water microemulsion or a nanoemulsion comprising at least one water-insoluble photoinitiator (in a non-particulate form), to thereby obtain a powder of nanoparticles of the at least one photoinitiator. The oil-in-water microemulsion or nanoemulsion may be prepared as known in the art. The micro- or nanoemulsions comprise water; at least one volatile water-immiscible organic solvent; at least one co-solvent; at least one surfactant; at least one water-insoluble photoinitiator; and optionally further materials or additives or actives. The additives or actives may be selected from at least one surfactant; at least one crystallization inhibitor; functional materials intended to provide functionality to a printed polymeric structure, such as at least one conductive material or a precursor of a conductive material, e.g., metallic nanoparticles and metal precursors, carbon nanotubes, graphene and derivatives thereof, and conductive polymers, biological materials, e.g., cells and microorganisms, proteins, peptides and polysaccharides, special effect colorants, e.g., fluorescent materials and responsive materials, and sensing materials.

Once the microemulsion or nanoemulsion is dried, namely the solvent or solvent system is removed, and depending on whether both the organic solvent and water are removed or only the organic solvent, the nanoparticles may be isolated as a solid powder or as a dispersion in water. In some embodiments, where a solid powder of the photoinitiator nanoparticles is desired, the method comprises preparing an oil-in-water microemulsion or nanoemulsion and removing the volatile water-immiscible organic solvent and the water to obtain a water dispersible powder comprising the water-insoluble photoinitiator. Where a water-dispersion of the photoinitiator nanoparticles is desired, the method comprises removing the volatile water-immiscible organic solvent, leaving behind a dispersion of the nanoparticles in water.

Alternatively, the solid powder or the water dispersion may be prepared from an alcohol-water mixture comprising the water-insoluble photoinitiator and at least one surfactant, and removing the volatile alcohol-water mixture so as to form a dispersible powder or water dispersion comprising the photoinitiator. In some embodiments, the alcohol is a lower alcohol selected from methanol, ethanol, propanol, isopropanol, butanol, and others.

Alternatively, the solid powder or the water-based or aqueous dispersion may be prepared from an aqueous mixture of water-miscible solvents comprising the water-insoluble photoinitiator and at least one surfactant, and removing the volatile aqueous mixture of water-miscible solvents so as to form a dispersible powder or water dispersion comprising the photoinitiator. In some embodiments, the water-miscible solvent is an organic solvent selected from acetone, acetonitrile, and others.

As compared to the non-particulate form, the nanoparticulate photoinitiator is water soluble, or has an improved water solubility as compared with the non-particulate form, or is better dispersible as compared with the non-particulate form. For example, for TPO, 3% w/w of TPO nanoparticles can be dispersed in water at 25° C., an amount that is ~1,000 times more than the amount of non-particulate TPO that may be dissolved in water, without a significant increase in viscosity.

Without wishing to be bound by theory, the powder of nanoparticles obtained following solvent evaporation comprises the particulate photoinitiator and optionally surfactants and other materials that are mixed. When the powder is dispersed in water, or in an aqueous medium, two populations of nanoparticles may form, depending, e.g., on the concentration of surfactants: (i) if the concentration of surfactants is lower than the critical micellar concentration the nanoparticulate photoinitiator will be dispersed as nanoparticles stabilized by surfactants; alternatively (ii) if the concentration is higher than the critical micellar concentration, the nanoparticulate photoinitiator will be solubilized in surfactant micelles. For example, in the first case, when 0.1% w/w TPO nanoparticles were dispersed in water, nanoparticles of a mean diameter of 250±21 nm were obtained. Whereas, when TPO nanoparticles at a concentration of 1% w/w or more were dispersed in water, micelles of sizes less than 5 nm (characterized by molecular weight cut-off filtration followed by UV spectroscopy) were obtained.

Thus, within the scope of the present application, the terms "dispersion" and "solubilization" when made in reference to nanoparticles of the invention, refer to the state of carrying these nanoparticles in water or in an aqueous or ink formulation. Unless otherwise or specifically noted, the terms may be used interchangeably to refer to dispersion of nanoparticles or solubilization of micellar forms or to a state of both dispersion of nanoparticles and solubilization of micellar forms.

The high solubility and/or dispersability of the nanoparticles of the invention stem both from their nanoparticulate form and/or their ability to form in solution material micelles. A water dispersion comprising the nanoparticles of the invention is thus stable and permits stable and effective polymerizable ink formulations. Where a dry nanoparticles powder is used, it may be similarly dispersed in a water-based medium to afford the dispersion.

Water dispersions of the invention are dispersions of nanoparticles of the invention in water or in a water-based medium; namely in a medium that is free of organic solvent(s). The water dispersions of the invention exhibit high molar extinction coefficient. In other words, the nanoparticulate photoinitiators comprised in the dispersions strongly absorb light at a desired wavelength, the absorption being at least 300 times stronger than that observed in the best known photoinitiator solution, as detailed hereinbelow. The molar extinction coefficient is typically greater than $10$ $M^{-1}$ $cm^{-1}$. In some embodiments, the molar extinction coefficient is between 10 and 1,000 $M^{-1}$ $cm^{-1}$. In some embodiments, the molar extinction coefficient is between 100 and 1,000 $M^{-1}$ $cm^{-1}$. In some embodiments, the molar extinction coefficient is between 200 and 1,000 $M^{-1}$ $cm^{-1}$, between 300 and 1,000 $M^{-1}$ $cm^{-1}$, 400 and 1,000 $M^{-1}$ $cm^{-1}$, between 500 and 1,000 $M^{-1}$ $cm^{-1}$, between 600 and 1,000 $M^{-1}$ $cm^{-1}$, between 700 and 1,000 $M^{-1}$ $cm^{-1}$, between 800 and 1,000 $M^{-1}$ $cm^{-1}$ or between 900 and 1,000 $M^{-1}$ $cm^{-1}$.

In some embodiments, the molar extinction coefficient is greater than 500 $M^{-1}$ $cm^{-1}$.

The high performance and strong absorption is most noticeable in the range of 300 and 800 nm.

In some embodiments, the wavelength used for photoinitiating polymerization of at least one polymerizable species in an ink formulation is between 300 and 800 nm. In some embodiments, the wavelength is between 320 and 500 nm, between 340 and 500 nm, between 360 and 500 nm, between 380 and 500 nm, between 400 and 500 nm, between 300 and 450 nm, between 320 and 450 nm, between 340 and 450 nm, between 360 and 450 nm, between 380 and 450 nm, between 300 and 420 nm, between 320 and 420 nm, between 340 and 420 nm, between 360 and 420 nm, between 380 and 420 nm or between 385 and 420 nm.

In some embodiments, the wavelength is between 380 and 800 nm or between 385 and 420 nm.

The water-insoluble photoinitiators that may be used in accordance with the invention are any such material. In some embodiments, the water-insoluble photoinitiator is a two-photon polymerization photoinitiator. In some embodiments, the nanoparticles of the invention comprise one or more photoinitiator, optionally selected from 2,4,6-trimethylbenzoyl-diphenylphosphine oxide (TPO), Titanocene I784, Camphorquinone (CQ), 2-isopropylthioxanthone (ITX), N,N-dimethylaminobenzoic acid ethyl ester (DMAB), monoacylphosphine oxides, bisacylphosphine oxides (e.g. Irgacure 819), 2-Benzyl-2-dimethylamino-1-(4-morpholinophenyl)-butanone-1 (Irgacure 369), 1,5-diphenyl-1,4-diyn-3-one (Diinone), 1-hydroxycyclohexylphenyl ketone (Irgacure 184), 1-[4-(2-hydroxyethoxy)-phenyl]-2-hydroxy-2-methyl-1-propane-1-one (Irgacure 2959), 2,2-dimethoxy-1,2-diphenylethan-1-one (Irgacure 651), 2-methyl-1-[4-(methylthio)phenyl]-2-(4-morpholinyl)-1-propanone (Irgacure 907) and diethoxyacetophenone.

In some embodiments, the photoinitiator is 2,4,6-trimethylbenzoyl-diphenylphosphine oxide (TPO), Titanocene I784, Camphorquinone (CQ), 2-isopropylthioxanthone (ITX), N,N-dimethylaminobenzoic acid ethyl ester (DMAB), monoacylphosphine oxides, bisacylphosphine oxides (e.g. Irgacure 819), 2-Benzyl-2-dimethylamino-1-(4-morpholinophenyl)-butanone-1 (Irgacure 369), 1,5-diphenyl-1,4-diyn-3-one (Diinone), 1-hydroxycyclohexylphenyl ketone (Irgacure 184), 1-[4-(2-hydroxyethoxy)-phenyl]-2-hydroxy-2-methyl-1-propane-1-one (Irgacure 2959), 2,2-dimethoxy-1,2-diphenylethan-1-one (Irgacure 651), 2-methyl-1-[4-(methylthio)phenyl]-2-(4-morpholinyl)-1-propanone (Irgacure 907), or diethoxyacetophenone.

The photoinitiator nanoparticles are generally spherical in shape with a diameter in the range of about 3 nm and 500 nm.

In some embodiments, the photoinitiator is formed into particles having a diameter of between 500 nm and 5 micron. In some embodiments, the photoinitiator is formed into particles having a diameter of between 500 nm and 1 micron, between 500 nm and 1.5 micron, between 500 nm and 2 micron, between 500 nm and 2.5 micron, between 500 nm and 3 micron, between 500 nm and 3.5 micron, between 500 nm and 4 micron or between 500 nm and 4.5 micron.

In some embodiments, the nanoparticles diameter is between 3 and 50 nm. In some embodiments, the nanoparticles diameter is between 3 and 50 nm, between 3 and 45 nm, between 3 and 40 nm, between 3 and 35 nm, between 3 and 30 nm, between 3 and 25 nm, between 3 and 20 nm, between 3 and 15 nm, between 3 and 10 nm, between 3 and 5 nm, between 5 and 50 nm, between 5 and 45 nm, between 5 and 40 nm, between 5 and 35 nm, between 5 and 30 nm, between 3 and 25 nm, between 3 and 20 nm, between 3 and 15 nm, between 3 and 10 nm, between 3 and 8 nm or between 3 and 5 nm.

In some embodiments, the nanoparticles diameter is between 10 and 80 nm. In some embodiments, the nanoparticles diameter is between 10 and 75 nm, between 10 and 70 nm, between 10 and 65 nm, between 10 and 60 nm, between 10 and 55 nm, between 10 and 50 nm, between 10 and 45 nm, between 10 and 40 nm, between 10 and 35 nm, between 10 and 30 nm, between 10 and 25 nm, between 15 and 80 nm, between 20 and 80 nm, between 25 and 80 nm, between 30 and 80 nm, between 35 and 80 nm, between 40 and 80 nm, between 45 and 80 nm, between 50 and 80 nm, between 55 and 80 nm, between 60 and 80 nm, between 65 and 80 nm, between 70 and 80 nm, between 20 and 70 nm, between 30 and 70 nm, between 40 and 60 nm, between 30 and 40 nm or between 30 and 50 nm.

In some embodiments, the nanoparticles diameter is between 100 and 500 nm. In some embodiments, the nanoparticles diameter is between 100 and 475 nm, between 100 and 450 nm, between 100 and 425 nm, between 100 and 400 nm, between 100 and 375 nm, between 100 and 350 nm, between 100 and 325 nm, between 100 and 300 nm, between 100 and 275 nm, between 100 and 250 nm, between 100 and 200 nm, between 200 and 500 nm, between 200 and 450 nm, between 200 and 400 nm, between 200 and 350 nm, between 200 and 300 nm, between 300 and 500 nm, between 350 and 500 nm or between 400 and 500 nm.

In some embodiments, the nanoparticles diameter is greater than 100, 150, 200, 250, 300, 350, 400 or 450 nm. In some embodiments, the nanoparticles diameter is greater than 35, 40, 45, 50, 55, 60, 65, 70 or 80 nm. In some embodiments, the nanoparticles diameter is greater than 3, 4, 5, 6, 7 or 8 nm. In some embodiments, the nanoparticles diameter is smaller than 3, 4, 5, 6, 7 or 8 nm.

In some embodiments, the nanoparticle diameter is between 180 and 350 nm.

In some embodiments, the powder of the invention provides a dispersion of nanoparticles being smaller than 500 nm. In some embodiments, the powder of the invention provides a dispersion of nanoparticles being smaller than 300 nm.

As stated herein, powders of the invention comprising a plurality of photoinitiator nanoparticles are suitable for dispersion in water, in a solvent-free aqueous medium or in an ink formulation such as UV curable ink formulations. The dispersion may be prepared by re-dispersing a powder in water to form the dispersion. Upon dispersion, some or all of the photoinitiator material may be solubilized as micelles or dispersed as nanoparticles, or a combination of the two.

The amount of the nanoparticulate powder introduced may be varied based on the desired final concentration of the photoinitiator dissolved, dispersed and/or that is present in micelle form. In some embodiments, the water-based dispersion is prepared by re-dispersing the nanoparticulate powder in an amount of between 0.1 and 10% w/w % relative to the amount of the polymerizable material.

The powder comprises the photoinitiator nanoparticles and optionally additional agents selected to increase stability of the powder, to increase its stability over time, and/or agents which assist dispersability of the nanoparticles in water. The additional agents may be generally at least one surfactant, e.g., at photoinitiator to surfactant ratio of 0.1-9.9 to 2:8; and at least one crystallization inhibitor e.g., at photoinitiator to crystallization inhibitor ratio of 0.1-9.9 to 1:1.

Typically, the solid powder form comprises at least one crystallization inhibitor for stabilizing the powder and prolonging its shelf-life. The inhibitor may be selected amongst polymers, such as polyvinylpyrrolidone, polyacrylic acid, cellulosic polymers, polyethylene oxide, polyvinyl alcohol, gelatins, cyclodextrins, silica, silicon dioxide, starch, starch derivatives and dextran.

In some instances, the additives may be added to the water dispersion and not to the solid powder. In some embodiments, the powder comprises or consists the nanoparticles of the invention and at least one crystallization inhibitor.

In some embodiments, the at least one surfactant is selected from a cationic surfactant, an anionic surfactant, an amphoteric surfactant, a non-ionic surfactant and mixtures thereof. In some embodiments, the at least one surfactant is selected amongst ionic or non-ionic surfactants. In some embodiments, the at least one surfactant is selected from polysorbates, alkyl polyglycol ethers, alkyl phenol polyglycol ethers, e.g., ethoxylation products of octyl- or nonylphenol, diisopropyl phenol, triisopropyl phenol; sulfosuccinate salts, e.g., disodium ethoxylated nonylphenol ester of sulfosuccinic acid, disodium n-octyldecyl sulfosuccinate, sodium dioctyl sulfosuccinate, and the like. In some embodiments, the surfactant is selected from ethoxylated sorbitan monooleate (Tween 80), sodium dodecyl sulfate, polyglycerol esters and ethoxilated alcohols (Brij), sorbitan monooleate (Span 80) and combinations thereof.

As stated herein, the solid powder and the aqueous dispersion comprising the nanoparticles of the invention may be used, independently, for making ink formulations. Thus, in accordance with the subject application, also provided are aqueous UV curable ink formulations comprising at least one polymerizable material and a plurality of photoinitiator nanoparticles according to the invention, said inks being essentially free of organic solvents.

The ink formulations, such as UV curable inks, or compositions are aqueous or water-based. In other words, the formulations are essentially free of an organic solvent and comprise water as the carrier solvent. Therefore, the ink formulations are regarded as being devoid or free of one or more organic solvents. As residual organic solvents may remain in the ink formulation, the solvents are never in an amount that assists or controls or modifies the solubility or dispersability of the nanoparticles. As used herein, "free of organic solvents", "essentially free of organic solvents" or "substantially free of solvents" refer to an ink formulation comprising water as the main or only liquid carrier, and a residual amount of no more than 1,000 ppm of an organic solvents. As the residual solvent may be carried from the processes for the preparation of the nanoparticles of the invention, or may be an impurity that is carried over by, e.g., a surfactant or any other additive or component of a dispersion, the residual solvent is typically selected from organic solvents typically used in the chemical industry and which are water-soluble solvents, such as lower alcohols (methanol, ethanol, propanol, isopropanol, butanol and others), acetone and others. The amount and selection of residual solvents, is not such that has an effect on the dispersability of the nanoparticles in water, but also has no limitation on the usability of the nanoparticles in, e.g., 2D and 3D printing of articles and devices for medicinal use.

The present invention further concerns an aqueous dispersion of photoinitiator nanoparticles according to the invention for use in the preparation of ink or printing formulations.

In the ink formulations, the nanoparticles population may be selected to meet the specific intended purpose and printing conditions. In some embodiments, the photoinitiator in the nanoparticles may be in an amorphous form, namely a solid having no long-range order or reduced crystalline state.

The nanoparticulate photoinitiators of the invention may be utilized in a variety of processes that traditionally utilize photo-induced reactions. Such processes may involve polymerization of a polymerizable material, being a monomer, oligomer, a pre-polymer, and a polymerizable polymer (capable of undergoing further polymerization or crosslinking) The polymerizable material may comprise one or more polymerizable moiety selected from an acrylate, a methacrylate, an acrylamide, a methacrylamide, a styrene group, a maleate, a fumarate, an itaconate, a vinyl ether, a vinyl ester, an allyl ether and an allyl ester. In some embodiments, the process is a UV induced polymerization.

The polymerizable materials may be selected amongst materials used in the construction of 2D or 3D features or patterns. Non-limiting examples of such polymerizable materials include acid containing monomers, acrylic monomers, amine containing monomers, crosslinking acrylic monomers, dual reactive acrylic monomers, epoxides/anhydrides/imides, fluorescent acrylic monomers, fluorinated acrylic monomers, high or low refractive index monomers, hydroxy containing monomers, mono and difunctional glycol oligomeric monomers, styrenic monomers, acrylamides, vinyl and ethenyl monomers and many others.

The present invention further contemplates a method of printing, the method comprising irradiating a pattern of a curable ink comprising at least one polymerizable material and nanoparticulate photoinitiator according to the invention, said irradiation being with light of a wavelength selected to cause polymerization of the at least one polymerizable material. In some embodiments, the curable ink is a UV curable ink.

The invention further provides a method of fabricating a 2D or 3D pattern or object, the method comprising depositing an ink formulation comprising at least one polymerizable material and nanoparticulate photoinitiator according to the invention, and curing said polymerizable material under light of a selected wavelength.

In some embodiments, the pattern formed or cured according to methods of the invention is a 3D matrix or 3D porous structure. In some embodiments, the 3D matrix is a hydrogel.

In some embodiments, a printing method according to the invention, or the nanoparticles of the invention are utilized for the construction of at least one device or element for use in medical and biotechnological applications.

The invention also provides a method of affecting polymerization of at least one polymerizable material, as defined herein or as known in the art, the method comprising irradiating said at least one polymerizable material in the presence of nanoparticles according to the invention to thereby affect polymerization.

The invention further contemplates use of nanoparticles according to the invention in the preparation of a water-based formulation such as an ink formulation.

Also provided is use of nanoparticles according to the invention in a method of printing, in a method of polymerization or in a method involving or comprising a step of photoinitiation.

The invention further provides a photoinitiation system or formulation comprising nanoparticles according to the invention.

The invention also relates to using at least one water-insoluble photoinitiator in the preparation of a water dispersion comprising nanoparticles of the at least one water-insoluble photoinitiator.

In some embodiments of any one aspect of the invention, the at least one water-insoluble photoinitiator is selected to form a water-based dispersion, e.g., in an aqueous medium such as an ink formulation, being a dispersion of nanoparticulate material of said at least one water-insoluble photoinitiator, such that the nanoparticulate material is of a size smaller than 500 nm.

In some embodiments of any one aspect of the invention, the at least one water-insoluble photoinitiator is selected to form a water-based dispersion, e.g., in an aqueous medium such as an ink formulation, being a dispersion of the at least one water-insoluble photoinitiator as micelles, such that the micelles are of a size smaller than 500 nm.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF THE INVENTION

Figure 1:
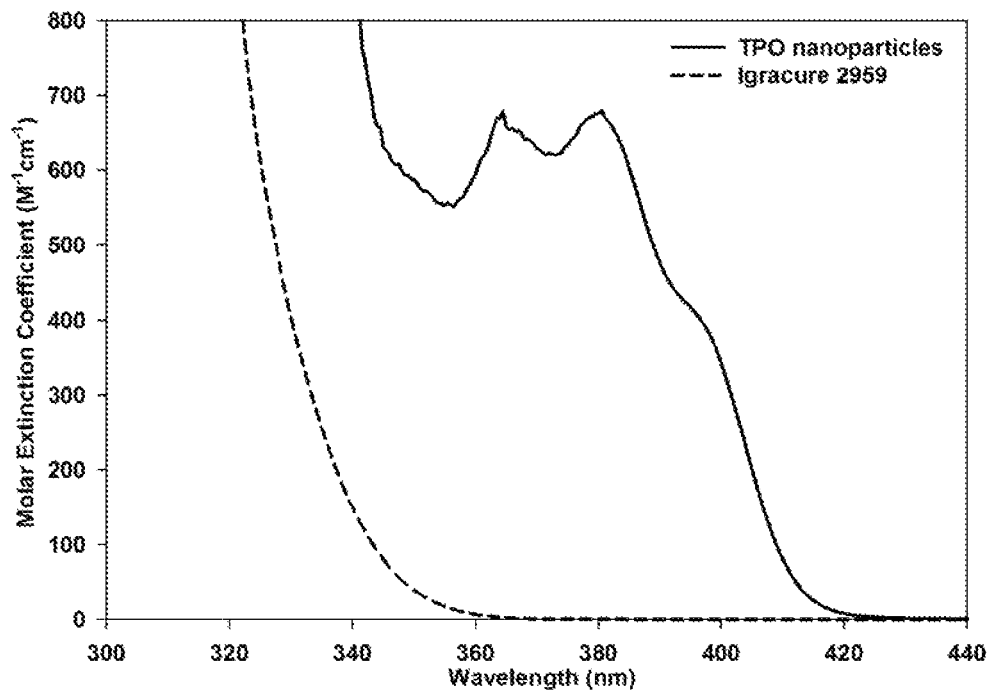
FIG. 1 depicts molar extinction coefficients of the TPO nanoparticles (solid line) and Igracure 2959 (dashed line) obtained by measuring absorbance of 4 mM aqueous solutions.

Example 1: Preparation of Photoinitiator Containing Microemulsions

TPO nanoparticles were prepared by rapid conversion of volatile microemulsions droplets, while using oil-in-water microemulsions containing TPO at various concentrations.

TABLE 1

Compositions (in % w/w) of microemulsions of TPO: nBuAc = n-butyl acetate; IPA = isopropyl alcohol; SDS = sodium dodecyl sulfate; PVP = polyvinylpyrrolidone (MW 40,000); TDW = Triple Distilled Water.

| Sample No. | TPO | nBuAc | IPA | SDS | PVP | TDW |
|---|---|---|---|---|---|---|
| 1 | 0 | 24 | 21.0 | 7.5 | 7.5 | 40 |
| 2 | 0.8 | 23.2 | 21.0 | 7.5 | 7.5 | 40 |
| 3 | 1.7 | 22.3 | 21.0 | 7.5 | 7.5 | 40 |
| 4 | 2.6 | 21.4 | 21.0 | 7.5 | 7.5 | 40 |
| 5 | 3.8 | 20.3 | 21.0 | 7.5 | 7.5 | 40 |
| 6 | 5.0 | 19.0 | 21.0 | 7.5 | 7.5 | 40 |

TABLE 2

Compositions (in % w/w) of alcohol-water mixtures (Sample No. 1-4) and microemulsions (Sample No. 5-6) of various photoinitiators; nBuAc = n-butyl acetate; IPA = isopropyl alcohol; SDS = sodium dodecyl sulfate; PVP = polyvinylpyrrolidone (MW 40,000); TDW = Triple Distilled Water.

| Sample No. | Photoinitiator Type | Amount | SDS | IPA | nBuAc | PVP | TDW |
|---|---|---|---|---|---|---|---|
| 1 | Ig 184 | 2.5 | 22.5 | 50 | 0 | 0 | 25 |
| 2 | Ig2959 | 2.5 | 22.5 | 50 | 0 | 0 | 25 |
| 3 | Ig651 | 2.5 | 22.5 | 50 | 0 | 0 | 25 |
| 4 | Ig907 | 2.5 | 22.5 | 50 | 0 | 0 | 25 |
| 5 | ITX | 1.5 | 7.5 | 21 | 22.5 | 7.5 | 40 |
| 6 | Ig819 | 1.5 | 7.5 | 21 | 22.5 | 7.5 | 40 |

The microemulsions and alcohol-water mixtures listed in Tables 1 and 2 were spray dried by a Mini Spray Dryer B-290 equipped with inert loop dehumidifier B-296 (Buchi, Flawil, Switzerland). Process conditions were: air inlet temperature 120° C. (±2° C.), drying chamber (outlet) temperature 60° C. (±2° C.), liquid introduction rate 5 mL·min$^{-1}$, spray flow rate 6.9 L·min$^{-1}$, aspirator rate 35 m$^3$·h$^{-1}$, nitrogen pressure 6 atmospheres. The resultant products were dry free-flowing powders (Tables 3 and 4), which were stored in tightly closed glass vials.

TABLE 3

Composition (in % w/w) of spray dried powders of TPO in nanoparticulate form: SDS = sodium dodecyl sulfate; PVP = polyvinylpyrrolidone (MW 40,000).

| Sample No. | TPO | SDS | PVP |
|---|---|---|---|
| 1 | 0 | 50 | 50 |
| 2 | 5 | 47.5 | 47.5 |
| 3 | 10 | 45 | 45 |
| 4 | 15 | 42.5 | 42.5 |
| 5 | 20 | 40 | 40 |
| 6 | 25 | 37.5 | 37.5 |

TABLE 4

Composition (in % w/w) of spray dried powders of TPO in nanoparticulate form: SDS = sodium dodecyl sulfate; PVP = polyvinylpyrrolidone (MW 40,000).

| Sample No. | Photoinitiator Type | Amount | SDS | PVP |
|---|---|---|---|---|
| 1 | Ig 184 | 10 | 90 | 0 |
| 2 | Ig2959 | 10 | 90 | 0 |
| 3 | Ig651 | 10 | 90 | 0 |
| 4 | Ig907 | 10 | 90 | 0 |
| 5 | ITX | 9.1 | 45.5 | 45.5 |
| 6 | Ig819 | 9.1 | 45.5 | 45.5 |

The powders obtained at the end of the spray drying process were dispersed (0.1-1 w/w) in TDW. The samples were vortexed for 1 min and magnetically stirred at room temperature for 5 min. This powder dispersing procedure was performed in order to have a reproducible procedure, although simple manual shaking of the dispersion for 1-2 min was sufficient to obtain a clear system.

Example 2: Efficiency of TPO Nanoparticles Photoinitiator

Photoinitiation is the most critical step in a photopolymerization process, which determines the kinetics and properties of the resulting polymerized objects. Rate of photopolymerization is generally proportional to the square root of the rate of initiation ($R_i$). For photoinitiated polymerization, $R_i$ is directly proportional to the incident light intensity, the concentration of photoinitiator and the intrinsic properties of the photoinitiator. The intrinsic properties of the photoinitiator that influence its utility are the molar extinction coefficient ($\varepsilon$), the quantum yield or cleavage events that occur per photon absorbed, and the photoinitiator efficiency or the ratio of initiation events to radicals generated by photolysis. For efficient polymerization, the initiator should have a large $\varepsilon$ and good overlapping absorbance spectrum with the emission spectrum of the light sources.

The molar extinction coefficient of TPO nanoparticles was measured and compared with the commercial water soluble photoinitiator I2959 using 4 mM aqueous solution. Absorption spectra were determined in the range of 300-440 nm, as this range reflects the emission of most commercially available UV lamps. As shown in FIG. 1, $\varepsilon$ of TPO nanoparticles at 365 nm was ~680 M$^{-1}$ cm$^{-1}$, more than 300 times larger than the commercially available and mostly used water soluble photoinitiator I2959 ($\varepsilon$=2.25 M$^{-1}$ cm$^{-1}$). Additionally, the TPO nanoparticles absorbs significantly in the visible region from 400 nm to 420 nm, making them suitable also for polymerization based on LED lamps used in DLP based 3D printing (Table 5).

TABLE 5

Molar Extinction Coefficients of TPO nanoparticles and I2959 at standard center wavelengths of light sources used for DLP-based 3D printers.

| | 365 nm | 385 nm | 395 nm | 405 nm |
|---|---|---|---|---|
| TPO Nanoparticles | 659.9 | 602.1 | 416.6 | 200.3 |
| I2959 | 2.3 | 0.1 | 0.0 | 0.0 |

The TPO nanoparticles were found superior to chemically modified TPO. A water soluble lithium salt of TPO that was synthesized and evaluated for its ability to polymerize poly(ethylene glycol) monomers into hydrogels was found inferior. The $\varepsilon$ of this water-soluble TPO salt was 218 M$^{-1}$ cm$^{-1}$ at 365 nm which was less than the reported ε of TPO in an organic medium, methyl methacrylate ($\varepsilon_{max}$~520 M$^{-1}$ cm$^{-1}$ at 381 nm). In comparison with both the reported molar extinction coefficients of the lithium salt of TPO in water and TPO in an organic solvent, the TPO nanoparticles exhibited larger wavelengths values in commonly available UV lamps. Overall, the high water dispersability and very high molar extinction coefficients at the UV range make the TPO nanoparticles excellent photoinitiators in 3D printing in aqueous solutions.

To determine the polymerization efficiency of TPO nanoparticles, polymerization kinetics of acrylamide in aqueous solutions with TPO nanoparticles was compared to that of aqueous solutions of the commonly used photoinitiator I2959. Fourier Transform Infrared Spectrophotometer, (ALPHA FT-IR Spectrometer, Bruker) was used in conjunction with platinum ATR single reflection diamond accessory (Sample scans 64; Resolution 4 cm$^{-1}$). The polymerization medium comprised aqueous solutions of 20% w/w monomer (acrylamide) with cross-linking monomer polyethylene glycol 600 diacrylate (5% w/w of the monomer) and photoinitiator (TPO nanoparticles or Igracure 2959 at concentration of 0.5% w/w of the monomer). The resulting aqueous acrylamide solutions had 2.9 mM of TPO and 4.5 mM of I2959. Measurements were performed on ~200 µl of polymerization solution dropped on the ATR diamond. The UV light was radiated onto the sample through a chamber (at 1.5 cm height) centered at the ATR diamond. Monochromatic UV LED (Integration Technology, Oxfordshire, UK) irradiating at 397 nm was used for photo-curing. IR spectra were recorded after every 4 seconds, for a total duration of 40 seconds. The polymerization kinetics was studied by monitoring the FTIR spectra in the range of 1800-800 cm$^{-1}$.

Figure 2:
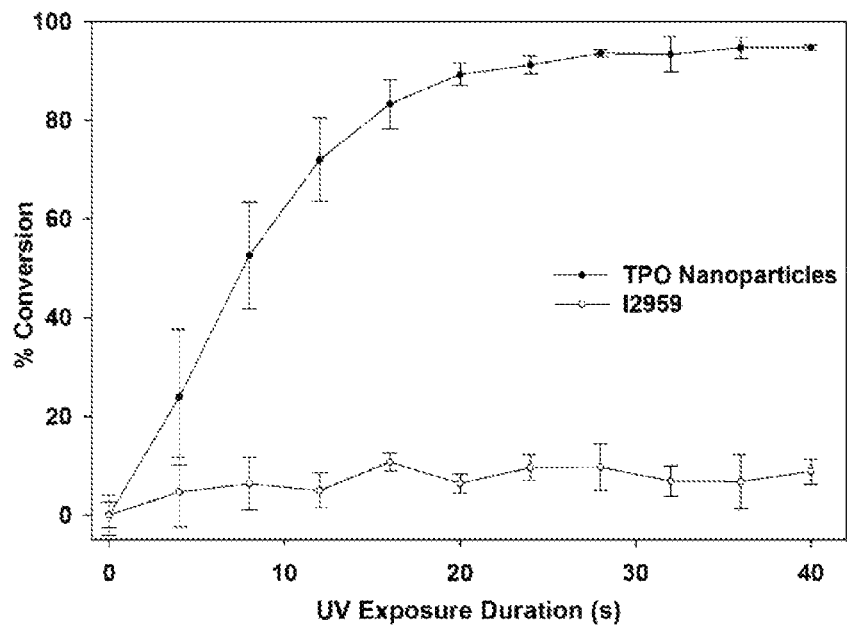
FIG. 2 depicts polymerization kinetics: Percent conversion of vinyl bonds calculated using aqueous acrylamide solutions with TPO nanoparticles and I2959 at 988 cm$^{-1}$ (assigned to the out-of-plane bending mode of the =C—H unit), normalized to the C=O stretching peak at 1654 cm$^{-1}$ as an internal standard, at varying UV (395 nm) exposure duration.
Figure 3:
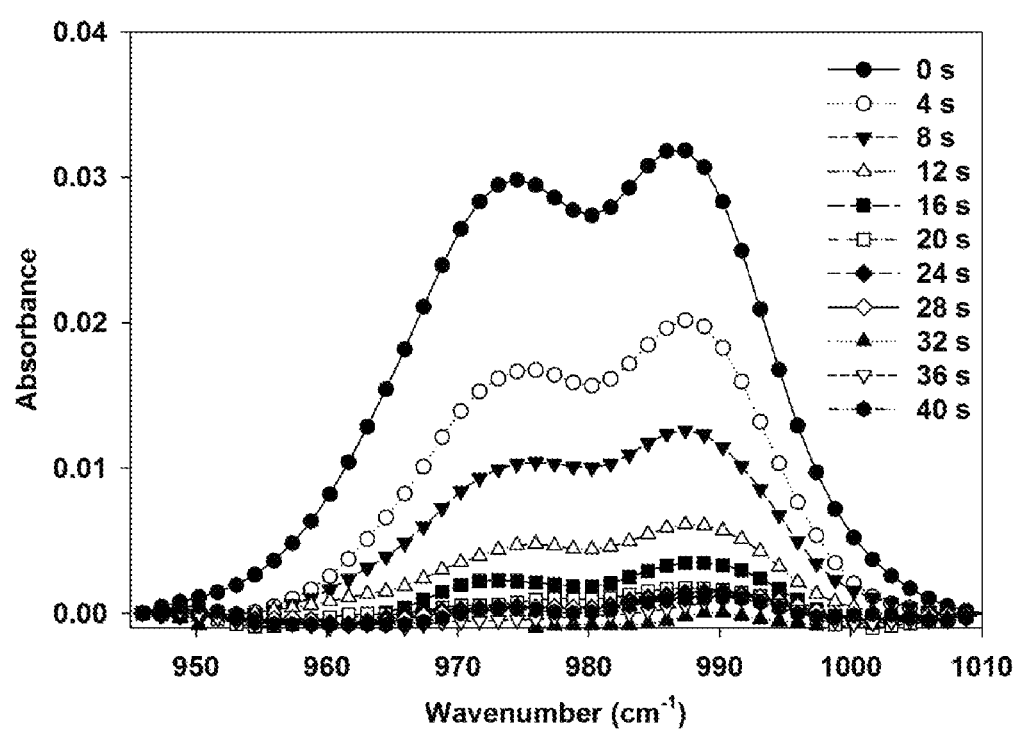
FIG. 3 depicts polymerization kinetics: Fourier transform infrared spectrum of acrylamide aqueous solutions with TPO nanoparticles acquired after every 4 seconds of UV exposure over the entire duration (40 seconds).
Figure 4:
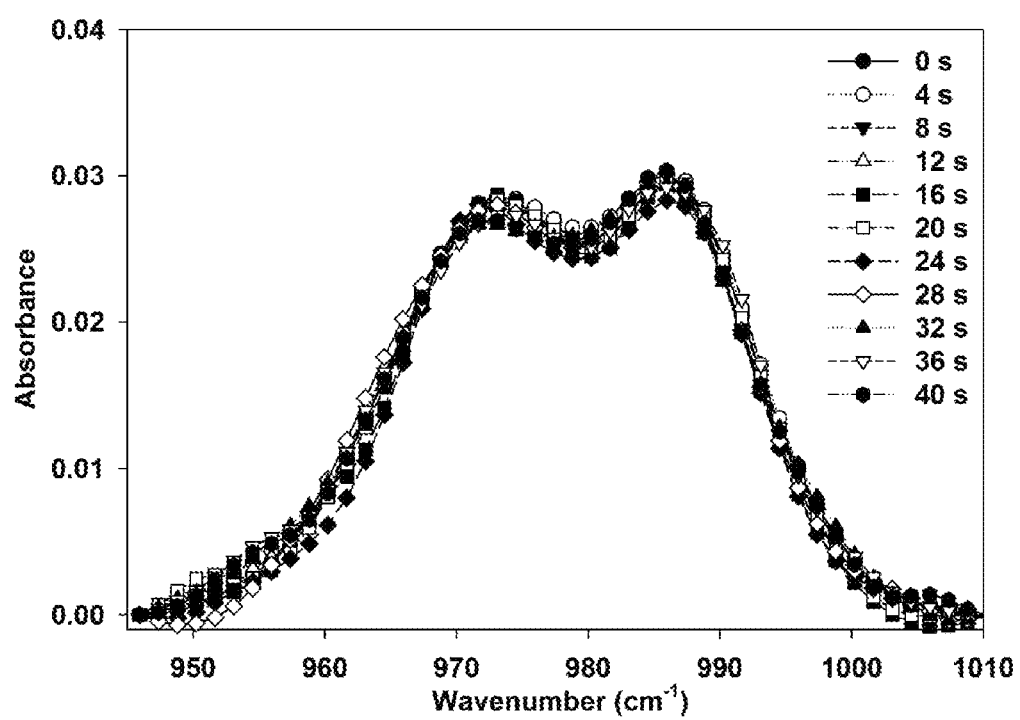
FIG. 4 depicts polymerization kinetics: Fourier transform infrared spectrum of acrylamide aqueous solutions with Irgacure 2959 acquired after every 4 seconds of UV exposure over the entire duration (40 seconds).
Figures 5A, 5B, 5C, 5D:
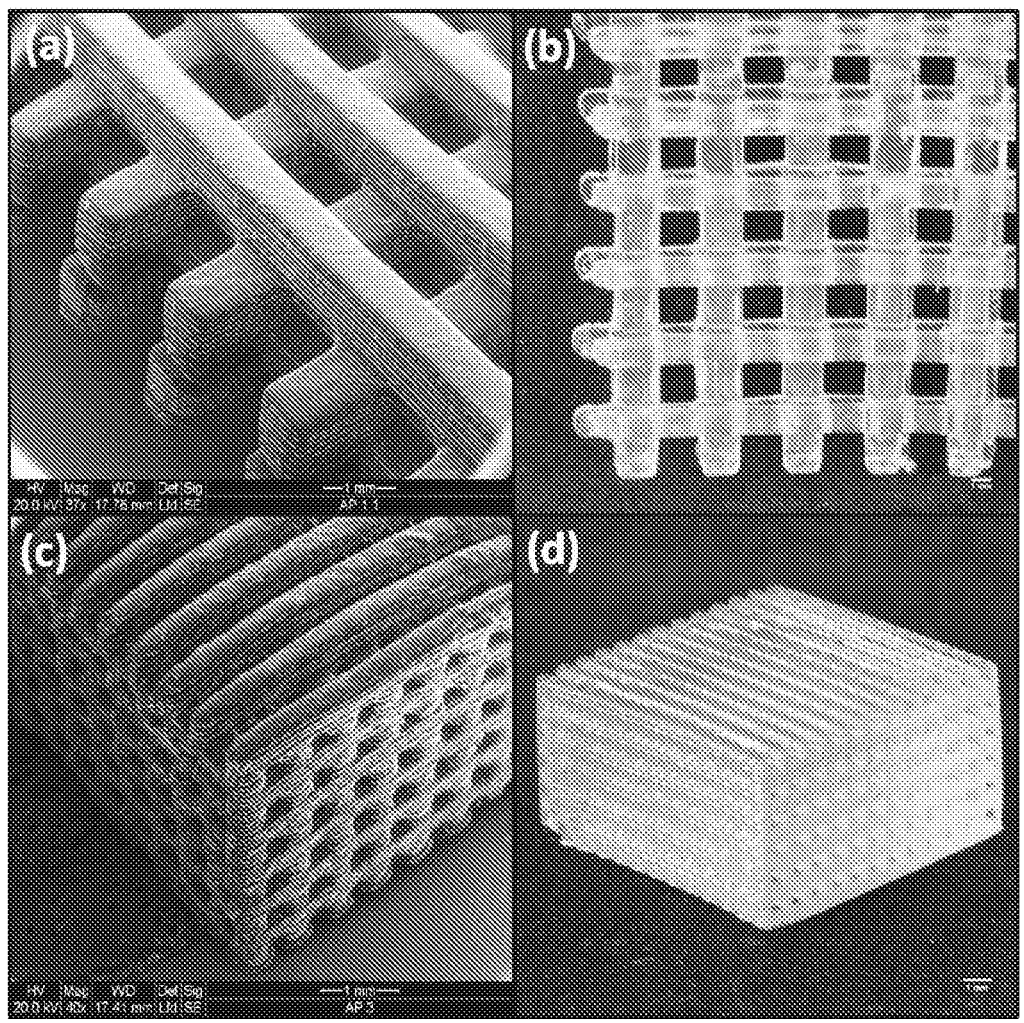
FIGS. 5A-D are representative images of printed structures captured by ESEM (FIGS. 5A and 5C) and digital camera (FIGS. 5B and 5D): 3D printed woodpile structured hydrogel-scaffold using TPO photo-initiator nanoparticles.

The % conversion of acrylamide was calculated from the decay/disappearance of the absorption peaks of methylene group vibrations at 988 cm$^{-1}$ (assigned to out-of-plane bending mode of the =C—H unit) normalized to the C=O stretching peak at 1654 cm$^{-1}$ as an internal standard. Area under the peak at 988 cm$^{-1}$ at different durations of UV exposure was compared with the sample with no UV exposure. As shown in FIG. 2, the TPO nanoparticles enabled much faster photopolymerization of acrylamide than I2959. With TPO nanoparticles, after ~40 seconds of irradiation, the =C—H bonds peaks disappeared completely (FIG. 3) and the sample on the ATR diamond was completely solidified. However, in case of solutions with I2959, even after curing of 300 seconds there was no significant change in =C—H bonds peaks (FIG. 4), while the sample on the ATR diamond remained in a liquid form. As expected, better polymerization profiles were obtained using TPO nanoparticles concordant with the much larger extinction coefficient of the TPO nanoparticles compared to the I2959. The measured efficiency of TPO nanoparticles to photopolymerize aqueous solutions of acrylamide in air at 25° C., was found to be highest among various water-compatible photoinitiators reported in the literature.

Example 3: Measurement of Photoinitiator Activity

To determine the polymerization efficiency of TPO nanoparticles, polymerization kinetics of acrylamide in aqueous solutions with TPO nanoparticles was compared to that of aqueous solutions of the commonly used photoinitiator I2959. Fourier Transform Infrared Spectrophotometer, (ALPHA FT-IR Spectrometer, Bruker) was used in conjunction with platinum ATR single reflection diamond accessory (Sample scans 64; Resolution 4 cm$^{-1}$). The polymerization medium comprised aqueous solutions of 20% w/w monomer (acrylamide) with cross-linking monomer polyethylene glycol 600 diacrylate (5 w/w of the monomer) and photoinitiator (TPO nanoparticles or Igracure 2959 at concentration of 0.5% w/w of the monomer). The resulting aqueous acrylamide solutions had 2.9 mM of TPO and 4.5 mM of I2959. Measurements were performed on ~200 µl of polymerization solution dropped on the ATR diamond. The UV light was radiated onto the sample through a chamber (at 1.5 cm height) centered at the ATR diamond. Monochromatic UV LED (Integration Technology, Oxfordshire, UK) irradiating at 397 nm was used for photo-curing. IR spectra were recorded after every 4 seconds, for a total duration of 40 seconds. The polymerization kinetics was studied by monitoring the FTIR spectra in the range of 1800-800 cm$^{-1}$.

The % conversion of acrylamide was calculated from the decay/disappearance of the absorption peaks of methylene group vibrations at 988 cm$^{-1}$ (assigned to out-of-plane bending mode of the =C—H unit) normalized to the C=O stretching peak at 1654 cm$^{-1}$ as an internal standard. Area under the peak at 988 cm$^{-1}$ at different durations of UV exposure was compared with the sample with no UV exposure. As shown in FIG. 2, the TPO nanoparticles enabled much faster photopolymerization of acrylamide than I2959. With TPO nanoparticles, after ~40 seconds of irradiation, the =C—H bonds peaks disappeared completely and the sample on the ATR diamond was completely solidified. However, in case of solutions with I2959, even after curing of 300 seconds there was no significant change in =C—H bonds peaks, while the sample on the ATR diamond remained in a liquid form. As expected, better polymerization profiles were obtained using TPO nanoparticles concordant with the much larger extinction coefficient of the TPO nanoparticles compared to the I2959. The measured efficiency of TPO nanoparticles to photopolymerize aqueous solutions of acrylamide in air at 25° C., was found to be highest among various water-compatible photoinitiators reported in the literature.

Example 4: 3D Printing of Model Hydrogel Using Aqueous UV Curable Ink

The suitability of TPO nanoparticles to enable photopolymerization in water was utilized in 3D printing of aqueous acrylamide formulation. The aqueous ink solutions contained 38.5% w/w acrylamide with cross-linking monomer (ethoxylated trimethylolpropane triacrylate, Sartomer 9035, 8.9% w/w of the monomer), photoinitiator (TPO nanoparticles or I2959 at concentration of 2.4% w/w of the monomer) and yellow dye (2.4% of the monomer; Duasyn Acid Yellow XX-SF liquid, Clariant, Germany) A pre-designed hydrogel model was 3D printed using a SLA 3D printer (Freeform Plus 39, Asiga, Australia). This printer operates by top-down stereolithography system with digital mirror device and UV-LED light source (385 nm). After 3D printing, the structures were rinsed with water in a sonication bath for one minute, to remove the monomer/photoinitiator residues. The structures were observed under environmental scanning electron microscope (FEI, Quanta 200 FEG, Hillsboro, USA).

3D printing of hydrogel was performed at a rate of 6 seconds per layer (100 µm layer thickness with 6 second irradiation to each layer). A stable woodpile structured hydrogel (build size 25×25×3 mm) (FIGS. 5A-D) was built within 25 minutes using TPO nanoparticles. It should be noted that the printed hydrogels had more than 60% w/w water content. To investigate the differences in the photoreactivity and 3D printing capabilities, hydrogel structure obtained from polymerizing aqueous solutions with TPO nanoparticles was compared those obtained from solutions with I2959. In contrast to inks containing TPO nanoparticles, no 3D structures could be printed using I2959 aqueous solutions. Even after increasing the curing time per layer (1.5 minute per layer) and the concentration of I2959 (up to 20% w/w of monomer) no hydrogel structure was obtained. The fast polymerization using TPO nanoparticles can be explained in terms of better solubility TPO, resulting in improved dispersion and thus fast availability of free monomer to the newly formed free radicals. Thus, based on these findings, the common and efficient PIs for organic based inks can be used now for 3D printing of aqueous systems, if converted into water dispersible nanoparticles.

Example 5: Preparation of UV Curable Ink Formulations Using Photoinitiator Nanoparticles Composition A:
Weigh 20 g of PEGylated diacrylate 600 (5R610). Add 80 g aqueous dispersion containing 2 g of TPO photoinitiator nanoparticles. Stir the dispersion to obtain a clear ink.

Composition B:
Weigh 40 g of PEGylated diacrylate 600 (5R610). Add 60 g aqueous dispersion containing 4 g of TPO photoinitiator nanoparticles. Stir the dispersion to obtain a clear ink.

Composition C:
Weigh 25 g of Acrylamide and 25 g of PEGylated diacrylate 600 (SR610) together. Add 50 g aqueous dispersion 5 g of TPO photoinitiator nanoparticles. Stir the dispersion to obtain a clear ink.

Composition D:
Weigh 20 g of N-vinyl caprolactam and 2 g of PEGylated diacrylate 600 (SR610) together. Add 80 g aqueous dispersion containing 2 g of TPO photoinitiator nanoparticles. Stir the dispersion to obtain a clear ink.

Composition E:
Weigh 40 g of 2-acryloylamino-2-methyl-propane sulfonic acid and 4 g of PEGylated diacrylate 600 (SR610) together. Add 60 g aqueous dispersion containing 3 g of TPO photoinitiator nanoparticles. Stir the dispersion to obtain a clear ink.

Composition F
Weigh 30 g of Acrylic acid and 3 g of PEGylated diacrylate 600 (SR610) together. Add 70 g aqueous dispersion containing 3 g of TPO photoinitiator nanoparticles. Stir the solution to obtain a clear solution.

Composition G:
Weigh 20 g of N-vinyl 2-pyrrolidone and 2 g of PEGylated diacrylate 600 (SR610) together. Add 80 g aqueous dispersion containing 2 g of TPO photoinitiator nanoparticles. Stir the dispersion to obtain a clear ink.

Composition H:
Weigh 30 g of 3-acryloxypropyl trimethoxysilane with 2 g sodium dodecyl sulfate and 3 g of PEGylated diacrylate 600 (SR610) together. Add 70 g aqueous dispersion containing 3 g of TPO photoinitiator nanoparticles. Stir the dispersion to obtain a clear ink.

Composition I:
Weigh 20 g of N-Isopropylacrylamide with 2 g sodium dodecyl sulfate and 2 g of PEGylated diacrylate 600 (SR610) together. Add 80 g aqueous dispersion containing 2 g of TPO photoinitiator nanoparticles. Stir the dispersion to obtain a clear ink.

UV curable ink compositions A-F were used separately for printing with 3D printer. Using Asiga composer software and .STL file for design, printing command was given with settings shown in Table 6:

TABLE 6

Setting for a 3D printer used in accordance with the invention.

| Exposure Time per Layer* (s) | 5-180 |
| Burn-In Layers | 0-10 |
| Burn-In Exposure Time (s)* | 0-240 |
| Layer Thickness [mm]* | 0.025-1.00 |
| Light Intensity mW/cm$^2$ | 17.5-28 |

*These setting were optimized for each printing and structure requirements.

Stable structured hydrogels were built using TPO photoinitiator nanoparticles. Based on the composition used the printed hydrogels had 50-80 w/w water content. Thus, based on these findings, the water dispersible photoinitiator nanoparticles can be used for high performance photo-polymerization including 3D printing of aqueous systems. This is on top of other printing applications as mentioned above.

Example 6: Preparation of Water-Dispersible Photoinitiator Nanoparticles for Surface and Deep Curing Composition I.
Weigh 0.5 g of Ig 184 (1-Hydroxy-cyclohexyl-phenyl-ketone) and 4.5 g of Sodium dodecyl sulfate together. Add 10 g Isopropanol and 5 g of TDW. Stir the mixture to obtain a clear solution.

Composition II.
Weigh 0.5 g of Ig 2959 (1-[4-(2-Hydroxyethoxy)-phenyl]-2-hydroxy-2-methyl-1-propane-1-one) and 4.5 g of Sodium dodecyl sulfate together. Add 10 g Isopropanol and 5 g of TDW. Stir the mixture to obtain a clear solution.

Composition III.
Weigh 0.5 g of Ig 651 (2,2-Dimethoxy-1,2-diphenylethan-1-one) and 4.5 g of Sodium dodecyl sulfate together. Add 10 g Isopropanol and 5 g of TDW. Stir the mixture to obtain a clear solution.

Composition IV
Weigh 0.5 g of Ig 907 (2-Methyl-4'-(methylthio)-2-morpholinopropiophenone) and 4.5 g of Sodium dodecyl sulfate together. Add 10 g Isopropanol and 5 g of TDW. Stir the mixture to obtain a clear solution.

Composition V
Weigh 0.3 g of ITX (2-Isopropylthioxanthone), 4.5 g of n-butyl acetate, 4.2 g of isopropanol, 1.5 g of sodium dodecyl sulfate, 1.5 g of polyvinylpyrrolidone and 8 g of TDW. Stir the mixture to obtain a clear microemulsion.

Composition VI
Weigh 0.3 g of Ig 819 (Bis(2,4,6-trimethylbenzoyl)-phenylphosphineoxide), 4.5 g of n-butyl acetate, 4.2 g of isopropanol, 1.5 g of sodium dodecyl sulfate, 1.5 g of polyvinylpyrrolidone and 8 g of TDW. Stir the mixture to obtain a clear microemulsion.

Composition VII
Weigh 0.2 g of ITX (2-Isopropylthioxanthone), 0.6 g of EDB (Ethyl 4-(dimethylamino) benzoate), 12 g of acetonitrile, 1.6 g of sodium dodecyl sulfate, 1.6 g of polyvinylpyrrolidone and 8 g of TDW. Stir the mixture to obtain a clear solution.

Composition VIII
Weigh 0.8 g of Ig 184 (1-Hydroxy-cyclohexyl-phenyl-ketone), 0.4 g of Ig 819 (Bis(2,4,6-trimethylbenzoyl)-phenylphosphineoxide), 4.5 g of n butyl acetate, 1.6 g of sodium dodecyl sulfate, 1.6 g of polyvinylpyrrolidone and 8.8 g of TDW. Stir the mixture to obtain a microemulsion.

The above solutions and microemulsions were separately spray dried by a Mini Spray Dryer B-290 equipped with inert loop dehumidifier B-296 (Buchi, Flawil, Switzerland). Process conditions were: air inlet temperature 120° C. (±2° C.), drying chamber (outlet) temperature 60° C. (±2° C.), liquid introduction rate 5 mL·min$^{-1}$, spray flow rate 414 normliter·h$^{-1}$, aspirator rate 35 m$^3$·h$^{-1}$, nitrogen pressure 6 atmospheres. The resultant products were dry free flowing powders, which were stored in tightly closed glass vials.

Alternatively, the solutions and microemulsions were separately lyophilized. Lyophilization was performed using laboratory-scale benchtop freeze-drying system (Labconco Freezone 2.5, Missouri, USA). Before lyophilization, microemulsions (30 mL sample in a 100 mL round bottom flask) were freezed in a bath of liquid nitrogen for 5 minutes. Then lyophilized at a temperature of −47±3° C. and absolute pressure of −0.470 mbar. The samples were kept in those conditions for 24 hours.

The powders obtained at the end of the spray drying process and lyophilization were dispersed (0.1-1 w/w) in TDW. The samples were vortexed for 1 min and magnetically stirred at room temperature for 5 min. This powder dispersing procedure was performed in order to have a reproducible procedure, although simple manual shaking of the dispersion for 1-2 min was sufficient to obtain a clear system.

Powders of photoinitiator nanoparticles obtained from composition I-III can be used for surface curing. Powders of photoinitiator nanoparticles obtained from composition IV-VI can preferably be used for thorough curing. Powders of composite photoinitiator nanoparticles obtained from composition VII-VIII can be used for inks requiring both surface and thorough curing.

The invention claimed is:

1. A solid water-dispersible powder comprising a plurality of nanoparticles, said nanoparticles consisting of at least one water-insoluble photoinitiator material, at least one surfactant and optionally at least one crystallization inhibitor.

2. The solid powder according to claim 1, comprising at least one crystallization inhibitor.

3. The solid powder according to claim 1, wherein the at least one photoinitiator material has a molar extinction coefficient of 10 and 1,000 M$^{-1}$ cm$^{-1}$ at between 300 and 800 nm.

4. The solid powder according to claim 1, adapted for forming a dispersion of nanoparticles and/or micelles of the at least one photoinitiator material in an aqueous medium, wherein the nanoparticles substantially consisting the at least one water-insoluble photoinitiator material.

5. The solid powder according to claim 4, wherein the aqueous medium is selected from water, an ink formulation and a UV curable ink formulation.

* * * * *